United States Patent [19]
Hoogendijk

[11] Patent Number: 5,180,973
[45] Date of Patent: Jan. 19, 1993

[54] SELF-CALIBRATING CRT MEASURING INSTRUMENT

[75] Inventor: Gerardus N. A. Hoogendijk, Almelo, Netherlands

[73] Assignee: U.S. Philips Corporation, New York, N.Y.

[21] Appl. No.: 748,122

[22] Filed: Aug. 21, 1991

[30] Foreign Application Priority Data

Aug. 20, 1990 [NL] Netherlands .......... 9001842

[51] Int. Cl.⁵ .............. G01R 15/10; G01R 13/20
[52] U.S. Cl. .......................... 324/130; 324/74; 324/121 R; 364/487; 364/571.01
[58] Field of Search ............. 324/130, 74, 115, 121 R; 364/487, 571.01; 307/231

[56] References Cited

U.S. PATENT DOCUMENTS

| | | | |
|---|---|---|---|
| 3,204,144 | 8/1965 | Deavenport | 324/121 R |
| 3,873,918 | 3/1975 | Talbert | 324/115 |
| 4,162,531 | 7/1979 | Rode et al. | 364/487 |
| 4,236,151 | 11/1980 | Russ et al. | 324/121 R |
| 4,553,091 | 11/1985 | Bristol | 364/571.01 |
| 4,705,961 | 11/1987 | Ainsworth et al. | 307/228 |
| 4,743,844 | 5/1988 | Odenheimer et al. | 324/115 |
| 4,764,721 | 8/1988 | Slavin | 324/130 |
| 4,974,181 | 11/1990 | Sinderson et al. | 364/487 |

OTHER PUBLICATIONS

Van Verzoek, UW; Octrooiraad; B699; May 8, 1991.

Primary Examiner—Ernest F. Karlsen
Attorney, Agent, or Firm—Bernard Franzblau

[57] ABSTRACT

A measuring instrument having a programmable time base circuit including a digitally adjustable integrator for generating a plurality of sawtooth voltages for the different operational states of a CRT display apparatus. The measuring instrument has an automatic calibration procedure for calibrating the various time base settings. A microcontroller drives the digitally adjustable integrator during calibration of the measuring instrument so as to calibrate the time base circuit for each operational state. A detection circuit detects whether the time base circuit is calibrated and provides a status signal to cause a digital memory in the microcontroller to store calibration values determined in the calibration procedure. During normal operation of the measuring instrument, the microcontroller drives the integrator of the time base circuit using the stored calibration values for the corresponding operational states.

8 Claims, 4 Drawing Sheets

SELF-CALIBRATING CRT MEASURING INSTRUMENT

BACKGROUND OF THE INVENTION

This invention relates to a measuring instrument for measuring and displaying signals, comprising a display system controlled by a time base circuit for displaying a signal to be applied to the measuring instrument under the control of the time base circuit which comprises a digitally adjustable integrator for generating sawtooth voltages with different slopes for different operational states of the display system.

The invention also relates to a time base circuit suitable for use in such a measuring instrument.

Such a measuring instrument is, for example, an oscilloscope in which the display system may be a cathode ray tube on which signal waveforms can be displayed. The oscilloscope is then supplied with a signal, for example, a periodic signal, which is applied on the one hand to the vertical deflection plates of the cathode ray tube via a vertical deflection system, and which is supplied on the other hand via a horizontal deflection system comprising the time base circuit. The time base circuit is periodically triggered in response to the signal so as to generate a sawtooth-shaped signal which is fed to the horizontal deflection system.

Such a measuring instrument is known from European Patent Application EP 0 113 975 A2. which corresponds to U.S. Pat. No. 4,705,961 Nov. 10, 1987. The time base circuit described therein comprises a digitally adjustable integrator, i.e. the current carried by an integration capacitor is digitally adjustable. An embodiment of such a digitally adjustable integrator is shown in FIGS. 3 and 4 of EP 0 113 975 and described in more detail on page 5, line 1 to page 8, line 26 of said Application. As is described on page 5, line 38 to page 6, line 9 thereof, the integration current may be supplied to different integration capacitors via a switch as a function of the desired time base setting, and the integration current itself may be digitally adjusted, as is described on page 7, lines 8–16 and page 8, lines 20–23 of EP 0 113 975 A2. FIG. 7 of said document in addition shows an electronic swich-over of, among other items, the integration capacitors. To have available an accurately calibrated time base for various time base settings, the time base should be calibrated, which may be done manually in that a known signal is applied to an input of the measuring instrument and it is visually checked for each time base setting whether the display system gives a desired response. The setting of the measuring instrument may be changed in the case of an incorrect response until a desired response takes place. Such a time consuming calibration procedure must be repeated in the case of changes of, for example, system characteristics of the measuring instruments if accurate measurements are to be insured.

SUMMARY OF THE INVENTION

An object of the invention is to provide a measuring instrument of the kind mentioned in the opening paragraph in which calibration takes place automatically.

A measuring instrument according to the invention is characterized in that the measuring instrument is provided with programmed means which are equipped to drive the digitally adjustable integrator in a calibration state of the measuring instrument with a calibration signal during the various operational states in such a way that the time base circuit is calibrated for each operational state, for which purpose an output of the time base circuit is coupled to a detection circuit for detecting whether the time base circuit is calibrated in an operational state and the programmed means derive a status signal from the detection circuit which indicates whether the time base circuit has been calibrated, in that the measuring instrument comprises digital storage means for storing the calibration values determined in the calibration state, and in that the programmed means are equipped to drive the integrator with the relevant calibration values in the corresponding operational states during normal operation. During calibration, the programmed means can drive electronic switches in the time base circuit in such a way that all time base states are calibrated by an identical procedure. The status signal may be a binary signal in which the transition from a first to a second value indicates that the time base has been calibrated.

The invention is based on the recognition that it is possible to achieve calibration iteratively in a closed loop system, the programmed means ensuring that a known signal, for example a pulse having a known amplitude and time duration, is supplied to the loop system.

The calibration procedure followed is not only simple and quick, and no stringent requirements are imposed on integration capacitors in the time base circuit as regards their accuracy, but the calibration procedure may also be simply repeated in order to insure that the measuring instrument remains within its specifications when system characteristics change. The calibration values are stored in a non-volatile memory in order to be retrieved therefrom during normal operation and to be supplied to the integrator in dependence on the time base setting.

It should be noted that U.S. Pat. No. 4,812,717 discloses digital means in the form of digital-to-analog converters for converting digital data into an analog signal for the adjustment of a current source.

Furthermore, reference is made to the handbook "Oscilloscopes", R. van Erk, McGraw- Hill 1978, ISBN 0-07-067050-1, page 12, FIG. 1.13, for a block diagram of an oscilloscope as a measuring instrument.

An embodiment of a measuring instrument according to the invention is characterized in that the detection circuit comprises a comparator which is coupled by a first input to the output of the time base circuit and which is provided with a second input for the supply of a reference signal, and in that the detection circuit further comprises a data flipflop whose data input is coupled to an output of the comparator, whose clock input receives the calibration signal in the calibration state, and whose output supplies the status signal. The calibration signal is integrated by the integrator and also is used as a clock signal for the data flipflop. The data flipflop takes up data at the falling edge of the pulsatory calibration signal. The output signal which results from a comparison of the integrated signal with a reference value is applied to the data flipflop as the data. The reference value here is equal to the desired integration value at the moment the data are clocked into the data flipflop. The most accurate calibration possible is achieved in that the integration current through the integrator is varied iteratively in such a way that the output of the data flipflop just changes its state.

A further embodiment of a measuring instrument according to the invention is characterized in that the measuring instrument comprises a temperature sensor, and calibration values are stored in the digital storage means in the calibration state for various temperatures, and in that the programmed means are equipped for driving the integrator with the respective calibration values during normal operation in dependence on the reading of the temperature sensor. As a result, the measuring instrument is ready for operation immediately after switching-on without a warming-up period being necessary for achieving a stable temperature condition. The calibration values may be stored in a two-dimensional lookup table, a first dimension for calibration values in the various time base states, and a second dimension for calibration values measured at different temperatures. It will be clear that the determination of calibration values at various temperatures can be time-consuming and will accordingly take place less frequently for practical reasons than in the case of a one-dimensional lookup table determined at operational temperature.

An embodiment of a measuring instrument according to the invention is characterized in that the time base circuit comprises digital means for setting a time base to a non-calibrated state relative to a calibrated state, in that the digital means can be driven from the programmed means, and in that the programmed means are equipped to display a non-calibrated time base state set by the digital means by means of the display means. In a measuring instrument such as an oscilloscope, the time base often comprises a so-called vernier setting for selecting intermediate positions of the time base. The time base is not calibrated then. If the vernier setting is carried out with digital means controlled by programmed means, the adjustment of the time base is known a priori. The known, non-calibrated setting is shown by the display means, so that the actual time base state is nevertheless known.

BRIEF DESCRIPTION OF THE DRAWING

The invention will be explained in more detail with reference to the accompanying drawing, in which.

DESCRIPTION OF THE PREFERRED EMBODIMENTS

Figure 1:
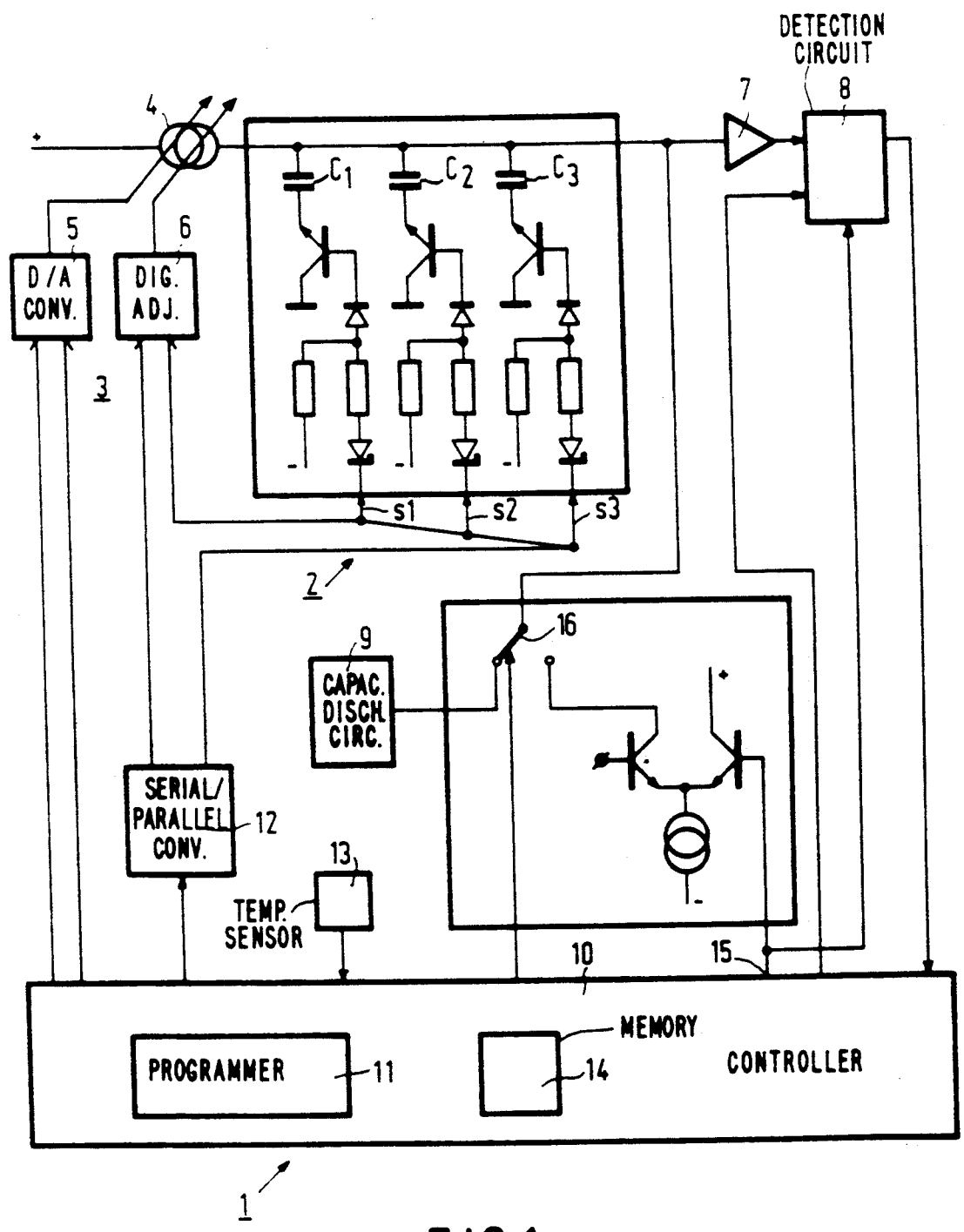
FIG. 1 shows a block diagram of a measuring instrument according to the invention.

FIG. 1 shows a block diagram of a measuring instrument 1 according to the invention with at least a portion of a time base circuit 2. A current source 4 which is adjustable by digital means 3 supplies a charging current to respective charging capacitors $C_1$, $C_2$ and $C_3$ which can be switched on as charging capacitors by digital control signals s1, s2 and s3. The digital means 3 comprise an digital-to-analog converter 5 and further digital adjustment means 6. The charging capacitors $C_1$, $C_2$ and $C_3$ are coupled to a buffer 7 which is coupled to a detection circuit 8 for detecting whether the time base circuit is calibrated in an operational state, during calibration of the time base circuit 2. An operational state may be the state in which at least one of the capacitors $C_1$, $C_2$ and $C_3$ is switched on. The time base circuit 2 further comprises discharging means 9 for discharging the capacitors $C_1$, $C_2$ and/or $C_3$. In a measuring instrument 1, such as an oscilloscope, after the time base circuit 2 has been started in known manner by a trigger signal derived from a periodic input signal applied to the measuring instrument, a sawtooth-shaped signal will first be generated through integration of a current supplied by the current source 4 for horizontal deflection of the signal to be displayed by a display system which comprises, for example, a cathode ray tube, after which the integration capacitors will be quickly discharged by the discharging means 9 during flyback of an electron beam in the cathode ray tube. Furthermore, the measuring instrument 1 comprises a microcontroller 10, such as an INTEL 8096, which comprises various interface circuits. The microcontroller 10 comprises programmed means 11 with, inter alia, a calibration procedure for calibrating the measuring instrument in various operational states. The programmed means 11 further generate drive signals for the digital-to-analog converter 5, drive signals s1, s2 and s3 through a serial-to-parallel converter 12, and drive signals for the further digital adjustment means 6. The measuring instrument 1 also comprises a temperature sensor 13 to make it possible to calibrate at various temperatures in the calibration state and to retrieve calibration values associated with a given temperature from a non-volatile memory 14 in the microcontroller 10 in the operational state. During calibration, the microcontroller 10 supplies a defined calibration signal, for example, a pulsatory signal having a known duration and amplitude, through an output 15 and a switch 16 to the time base circuit 2 in order to be integrated. The pulsatory signal at the output 15 of the microcontroller 10 is also supplied to the detector circuit 8 as a clock signal, which detector circuit processes information about the integrated pulsatory signal on the falling edge of the pulse.

Figure 2:
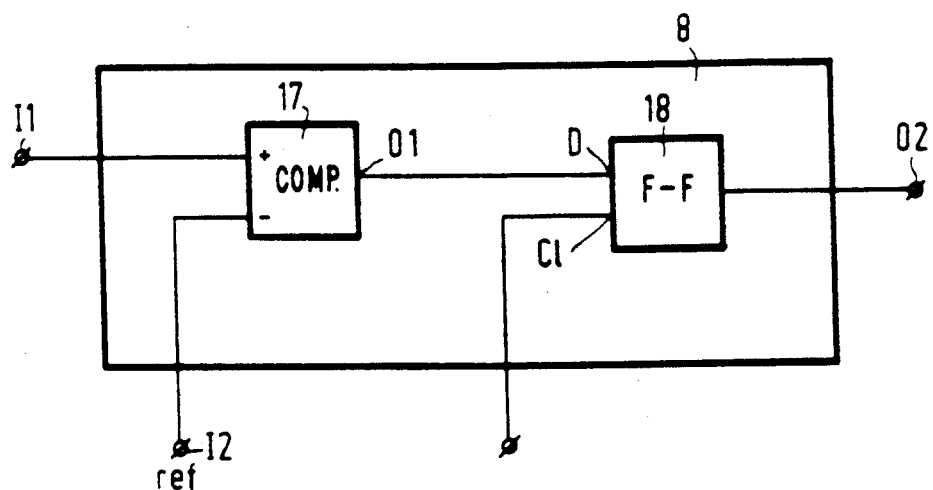
FIG. 2 shows a detection circuit in a measuring instrument according to the invention.

FIG. 2 shows in more detail a detection circuit 8 according to the invention. The detection circuit 8 comprises a comparator 17 which is coupled to the buffer 7 described with reference to FIG. 1 via an input I1. In addition, a reference signal ref is supplied to an input I2 of the comparator 17. An output O1 of the comparator 17 is coupled to a data input D of a data flipflop 18, which further comprises a clock input C1. An output O2 of the data flipflop 18 provides a status signal concerning the calibration of the measuring instrument and supplies it to the microcontroller 10 during calibration of the measuring instrument 1.

Figure 3:
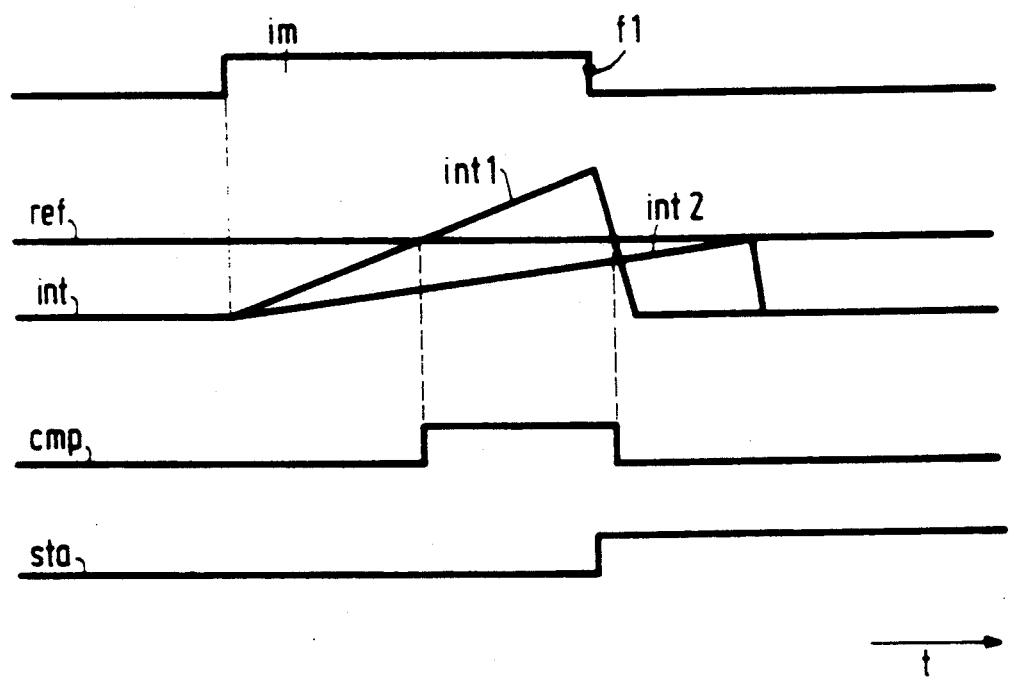
FIG. 3 shows some signals as a function of time in a measuring instrument according to the invention during its calibration.

FIG. 3 shows signals as a function of time t in a measuring instrument 1 according to the invention and during its calibration. The microcontroller 10 supplies a pulsatory signal im which is offered to the time base circuit 2 for integration and also serves as a clock signal for the data flipflop 18. The data flipflop 18 clocks in the output value of the comparator 17 on a falling edge f1 of the pulsatory signal im. The reference signal ref is chosen so that in an operational state the integrated signal int becomes just equal to the reference signal ref during clocking in the calibrated state. As can be seen in FIG. 3, integration is too quick in the case of the sawtooth waveform int1 and too slow in the case of the waveform int 2. With int 1, the comparator signal cmp is high during clocking, whereas it is low with int 2. Upon variation of the slope of the sawtooth-shaped signal int, a low-high or high-low transition should just occur. The calibration procedure to be carried out with the programmed means 11 is offered the status signal at the output O2. The calibration values determined during the various calibrations are stored in the non-volatile memory 14.

Figure 4:
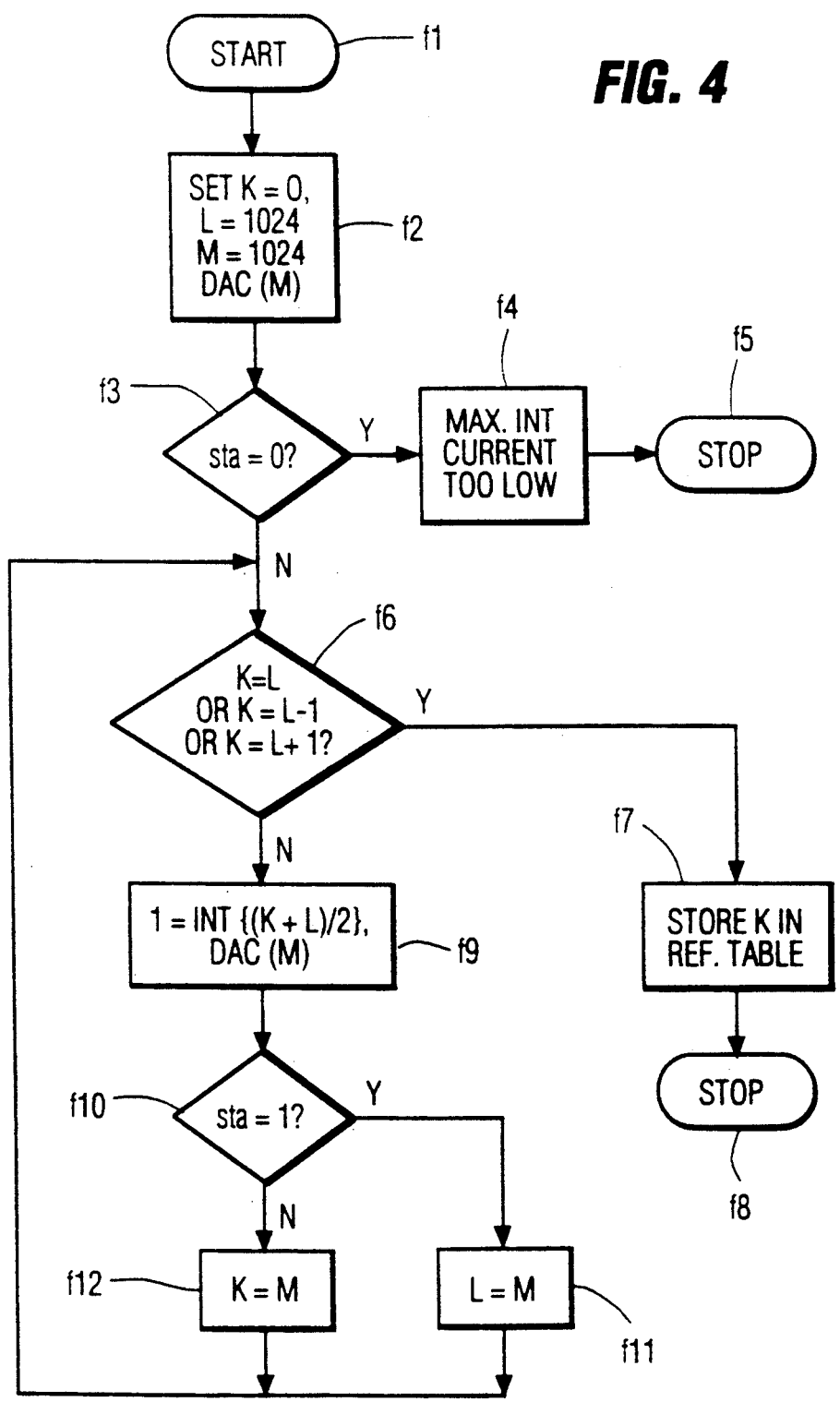
FIG. 4 shows a flow chart of a calibration procedure according to the invention.

FIG. 4 shows a flow chart of a calibration procedure according to the invention to be carried out with the programmed means 11. In an operational state, an initial bit configuration is supplied to the digital-to-analog converter 5 by the microcontroller 10, for example, "11111 .... 1" or "00000 .... 0", for example 10 bits. If a start is made with 10 bits (1024), "11111 .... 1", then initially a too high integration current should occur, and the signal sta at the output O2 of the data flip-flop 18 is "1" (high). The output O2 is "0" (low) in the case of a too low current. After a START in f1, a number of variables is initialized in f2, $K=0$, $L=1024$, $M=1024$, and DAC(M), where DAC(M) indicates the supply of data by the microcontroller 10. Subsequently, it is checked in f3 whether the signal sta is "0". If so, it is detected in f4 that the maximum integration current is too low, and a stop is made, for example, in f5. If the maximum integration current is sufficiently high, it is checked in f6 whether the current source is correctly adjusted through a check of whether $K=L$, or $K=L-1$, or $K=L+1$. If this is the case, K is stored in the non-volatile memory 14 in a reference table in f7. A stop is made in f8. If the current source is not yet correctly adjusted, then we get in f9: $M=INT\{(K+L)/2\}$, and the digital-to-analog converter applies a new drive signal to the current source 4 with DAC(M). It is checked in f10 whether the status signal sta at the output O2 is "1". If it is, we get $L=M$ in f11, if not, we get $K=M$ in f12. Then another check is made in f6 whether the current source is correctly adjusted.

Figure 5:
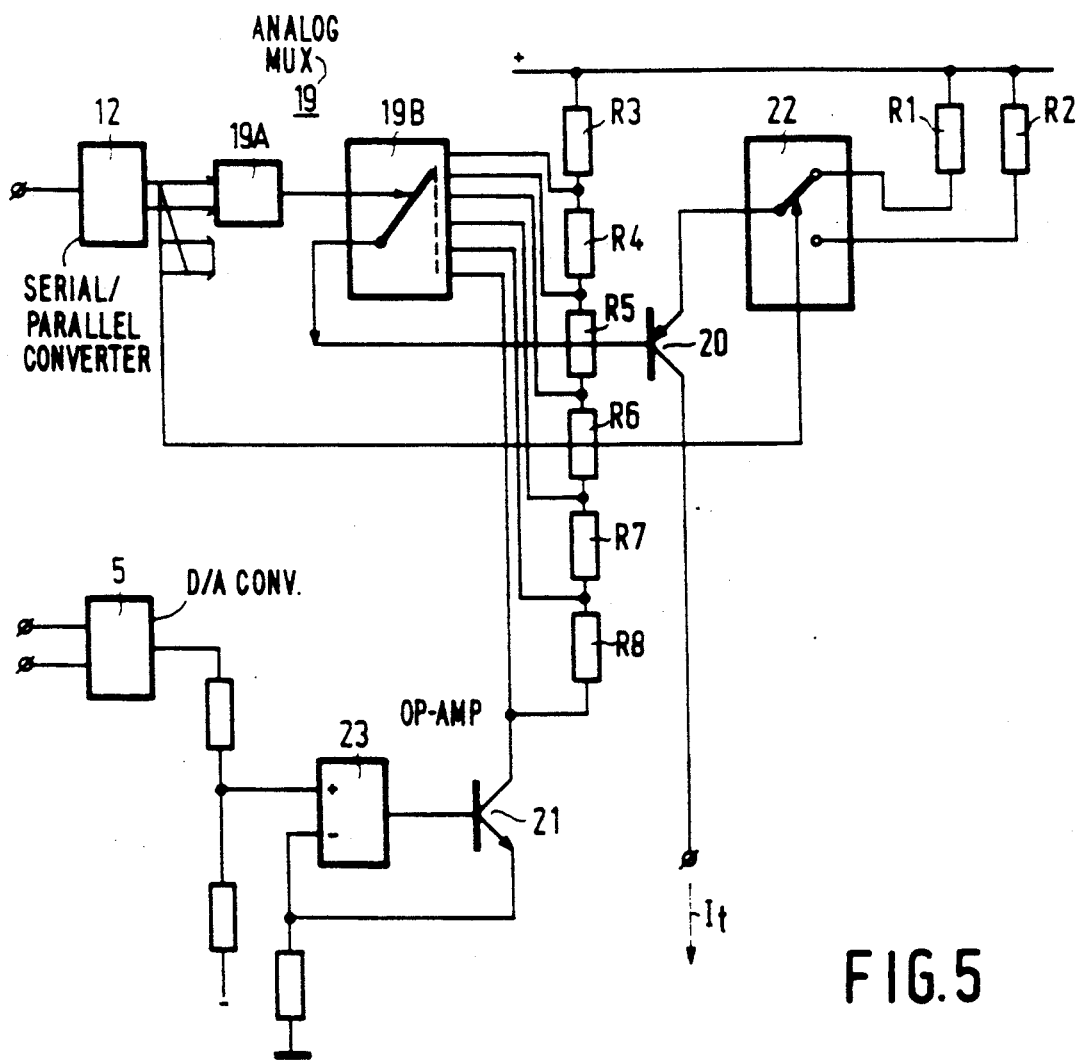
FIG. 5 shows in more detail the generation of a digitally adjustable integration current.

In FIG. 5, the generation of a digitally adjustable integration current is shown in more detail. The microcontroller supplies drive bits to the serial-to-parallel converter 12, which is, for example, a commercially available IC TEA1017. A current source 20 may be digitally adjusted in various operational states with switched-on charging capacitors via an analog multiplexer 19, for example, an IC HEF4051, with an address portion 19A and a switching portion 19B. Furthermore, the current source 20 can be adjusted via emitter follower 21 which is driven by the digital-to-analog converter 5. The current $I_t$ can in addition be varied by various resistors to be included in the emitter circuit of the current source 20 under the control of the serial-to-parallel converter 12, for example, with two resistors R1 and R2 in a ratio of 1:10, which are switched, for example, with an analog multiplexer 22 such as an IC HEF4053. The multiplexer circuit comprises, for example, resistors R3, R4, R5, R6, R7 and R8 with the values 50, 75, 125, 250, 750 and 1250 ohms, respectively. The output voltage of the digital-to-analog converter 5 is supplied to the emitter follower 21 through an operational amplifier 23, for example, an LM358. In the calibrated state, the collector of the emitter follower 21 is at a voltage which is determined by the digital converter 5 for a given operational state. Often a measuring instrument 1, such as an oscilloscope, will have a vernier adjustment for the time base circuit 2, i.e. the time base is set in relation to a calibrated position in a non-calibrated way in an operational state. According to the invention, a few bits of the digital-to-analog converter 5 are used for achieving the vernier setting. The vernier setting is then known in the programmed means 11. The accompanying known adjustment of the time base circuit 2 is shown by display means. In the example given, 9 different settings of the sawtooth voltage are possible for each charging capacitor. As is usual for oscilloscopes, the time base is coarsely set in a ratio of 1:2:5. One calibration value is determined for each charging capacitor in the given example, although variations are possible in this respect. The setting of the digital-to-analog converter 5 should be so adjustable during calibration that, for example, a dispersion of 10% in the values of the charging capacitors can be accommodated.

Figure 6:
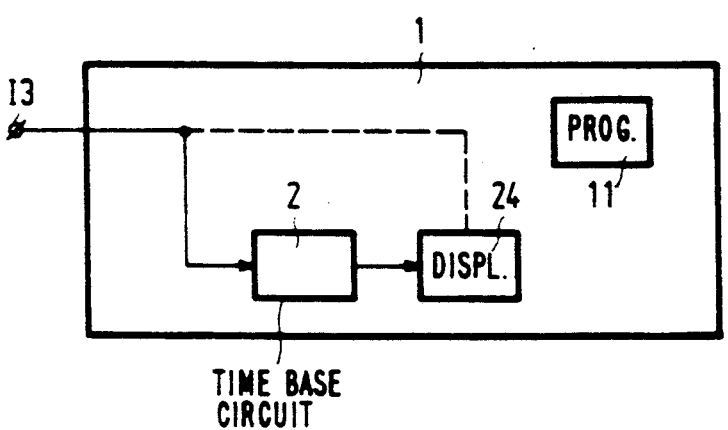
FIG. 6 shows a simplified block diagram of a measuring instrument according to the invention.

FIG. 6 finally shows a simplified block diagram of a measuring instrument 1 according to the invention, with an input 13 for the supply of a signal to be measured, a time base circuit 2, display means 24, and programmed means 11.

I claim:

1. A self-calibrating measuring instrument having a calibration state and operational states and comprising; a display system for displaying an input signal and controlled by a time base circuit, wherein the time base circuit comprises a digitally adjustable integrator for generating sawtooth voltages with different slopes corresponding to different operational states of the display system, a programmed means which, in the calibration state, drives the digitally adjustable integrator with a calibration signal for the various operational states such that the time base circuit is calibrated for each operational state, an output of the time base circuit being coupled to a detection circuit for detecting whether the time base circuit is calibrated in an operational state thereby to derive a status signal which is supplied to the programmed means and which indicates whether the time base circuit has been calibrated, digital storage means for storing calibration values determined in the calibration state, and wherein during normal operation of the measuring instrument, the programmed means drive the integrator with the relevant calibration values for the corresponding operational states.

2. A measuring instrument for measuring and displaying a signal wherein the measuring instrument has a calibration mode, said instrument comprising;
   a display system for displaying a signal input to the measuring instrument, said display system having a plurality of operational states,
   a time base circuit for controlling the display system, wherein the time base circuit includes a digitally adjustable integrator for generating sawtooth voltages with different slopes as a function of a selected operational state,
   a first programmed means including means for providing a calibration signal for calibrating the time base circuit in any of the operational states when the measuring system is in the calibration mode,
   digital storage means for storage of calibration values determined in the calibration mode, and
   a second programmed means including means for providing, during normal operation of the measuring instrument, said integrator with calibration values determined during the calibration mode and stored in the digital storage means.

3. A measuring instrument as claimed in claim 1, wherein the detection circuit comprises; a comparator having a first input coupled to the output of the time base circuit and a second input for receiving a reference signal, and a data flipflop whose data input is coupled to an output of the comparator, whose clock input receives the calibration signal in the calibration state, and whose output supplies the status signal.

4. A measuring instrument as claimed in claim 1, 3 or 2 characterized in that the measuring instrument comprises a temperature sensor, and calibration values are stored in the digital storage means in the calibration state for various temperatures, and in that during normal operation the programmed means drive the integrator with the respective calibration values in dependence on the reading of the temperature sensor.

5. A measuring instrument according to claim 2 further comprising; a detection circuit coupled to an output of the time base circuit for detection of completion of calibration and for providing a status signal indicative thereof.

6. A measuring instrument according to claim 3, wherein the first and second programmed means are integrated in a single processor.

7. A measuring instrument as claimed in claim 4, wherein
 the time base circuit comprises digital means for setting a time base to a non-calibrated state relative to a calibrated state,
 the digital means are driven by the programmed means, and
 the programmed means are equipped for displaying a non-calibrated time base state set by the digital means by means of the display means.

8. A measuring instrument as claimed in claim 1, 3 or 2, characterized in that the time base circuit comprises digital means for setting a time base to a non-calibrated state relative to a calibrated state, in that the digital means are driven by the programmed means, and in that the programmed means are equipped for displaying a non-calibrated time base state set by the digital means by means of the display means.

* * * * *